US010115721B2

(12) United States Patent
Hafez et al.

(10) Patent No.: US 10,115,721 B2
(45) Date of Patent: *Oct. 30, 2018

(54) PLANAR DEVICE ON FIN-BASED TRANSISTOR ARCHITECTURE

(71) Applicant: INTEL CORPORATION, Santa Clara, CA (US)

(72) Inventors: Walid M. Hafez, Portland, OR (US); Peter J Vandervoorn, Portland, OR (US); Chia-Hong Jan, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 31 days.

This patent is subject to a terminal disclaimer.

(21) Appl. No.: 15/167,006

(22) Filed: May 27, 2016

(65) Prior Publication Data

US 2016/0276346 A1   Sep. 22, 2016

Related U.S. Application Data

(63) Continuation of application No. 13/995,755, filed as application No. PCT/US2013/034729 on Mar. 30, 2013, now Pat. No. 9,356,023.

(51) Int. Cl.
*H01L 29/76* (2006.01)
*H01L 27/088* (2006.01)
(Continued)

(52) U.S. Cl.
CPC .. *H01L 27/0886* (2013.01); *H01L 21/823431* (2013.01); *H01L 29/161* (2013.01); *H01L 29/1608* (2013.01)

(58) Field of Classification Search
CPC ............ H01L 29/7831; H01L 27/0886; H01L 29/1608; H01L 29/161; H01L 29/7848;
(Continued)

(56) References Cited

U.S. PATENT DOCUMENTS 9,356,023 B2 * 5/2016 Hafez ................. H01L 27/0886
2008/0057644 A1 * 3/2008 Kwak ............... H01L 21/76224
438/257
(Continued)

FOREIGN PATENT DOCUMENTS

JP      2003-229575 A    8/2003
JP      2006-135067 A    5/2006
(Continued)

OTHER PUBLICATIONS

International Search Report and Written Opinion received for PCT Patent Application No. PCT/US2013/034729, dated Jan. 14, 2014, 12 Pages.
(Continued)

*Primary Examiner* — Kevin M Picardat
(74) *Attorney, Agent, or Firm* — Finch & Maloney PLLC

(57) ABSTRACT

Techniques are disclosed for forming a planar-like transistor device on a fin-based field-effect transistor (finFET) architecture during a finFET fabrication process flow. In some embodiments, the planar-like transistor can include, for example, a semiconductor layer which is grown to locally merge/bridge a plurality of adjacent fins of the finFET architecture and subsequently planarized to provide a high-quality planar surface on which the planar-like transistor can be formed. In some instances, the semiconductor merging layer can be a bridged-epi growth, for example, comprising epitaxial silicon. In some embodiments, such a planar-like device may assist, for example, with analog, high-voltage, wide-Z transistor fabrication. Also, provision of such a planar-like device during a finFET flow may allow for the formation of transistor devices, for example, exhibiting lower capacitance, wider Z, and/or fewer high electric field locations for improved high-voltage reliability, which may
(Continued)

make such devices favorable for analog design, in some instances.

20 Claims, 11 Drawing Sheets

(51) Int. Cl.
    *H01L 21/8234*     (2006.01)
    *H01L 29/16*     (2006.01)
    *H01L 29/161*     (2006.01)

(58) Field of Classification Search
    CPC ..... H01L 21/823431; H01L 21/823468; H01L 21/823481
    USPC ........ 257/365, 192, 401, 369, 350; 438/152, 438/153, 154, 218
    See application file for complete search history.

(56) References Cited

U.S. PATENT DOCUMENTS

| | | |
|---|---|---|
| 2009/0315112 A1 | 12/2009 | Lee |
| 2011/0095378 A1 | 4/2011 | Lee et al. |
| 2011/0133285 A1 | 6/2011 | Liaw |
| 2011/0147848 A1* | 6/2011 | Kuhn ................ H01L 21/76229 257/368 |
| 2012/0091538 A1 | 4/2012 | Lin et al. |
| 2012/0126375 A1 | 5/2012 | Wang et al. |
| 2014/0239399 A1 | 8/2014 | Nagumo |
| 2014/0291766 A1 | 10/2014 | Hafez et al. |

FOREIGN PATENT DOCUMENTS

| | | |
|---|---|---|
| JP | 2012-243784 A | 12/2012 |
| TW | 201216467 A1 | 4/2012 |
| WO | 2014163603 A1 | 10/2014 |

OTHER PUBLICATIONS

Office Action received for Taiwan Application No. 103111027, dated Jun. 15, 2015, 5 pages of English Translation and 4 pages of Office Action.

International Preliminary Report on Patentability received for PCT Patent Application No. PCT/US2013/034729, dated Oct. 6, 2015, 8 pages.

Taiwan Office Action and Search Report for related application No. TW 105122427, dated Jan. 19, 2017, 13 pages.

Japanese Office Action with translation for related application No. JP 2016-505451, dated Jan. 31, 2017, 4 pages.

GB Office Action for GB Application No. 1514055.1 dated Nov. 29, 2017, 4 pages. Received on Jan. 25, 2018.

* cited by examiner

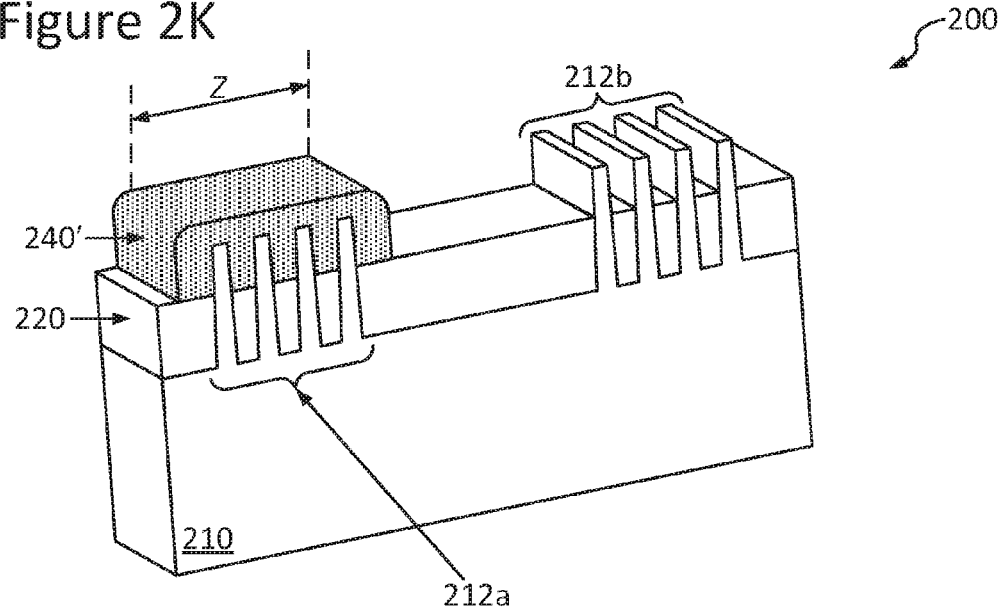
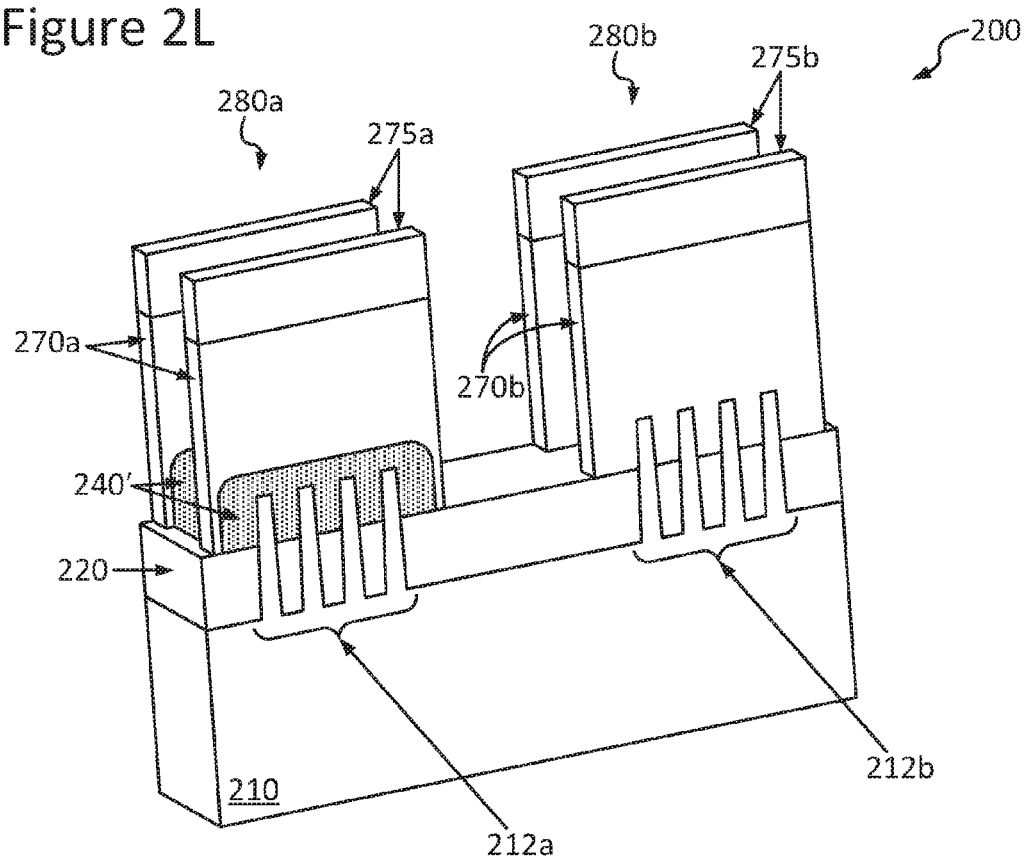

US 10,115,721 B2

PLANAR DEVICE ON FIN-BASED TRANSISTOR ARCHITECTURE

RELATED APPLICATION

This application is a continuation of U.S. patent application Ser. No. 13/995,755 filed Jun. 19, 2013 (now U.S. Pat. No. 9,356,023), which is a 371 U.S. International stage application of PCT/US2013/034729 filed Mar. 30, 2013. Each of these applications is herein incorporated by reference in their entirety.

BACKGROUND

Integrated circuit design in the deep-submicron process nodes (e.g., 32 nm and beyond) involves a number of non-trivial challenges, and circuits incorporating microelectronic components such as transistors have faced particular complications at these levels, such as those with respect to achieving scaled device features for analog designs. Continued process scaling will tend to exacerbate such problems.

BRIEF DESCRIPTION OF THE DRAWINGS

FIG. 1A is a cross-sectional side view of an IC configured in accordance with an embodiment.

FIG. 1B is a cross-sectional side view of the IC of FIG. 1A after forming a blocking layer, in accordance with an embodiment.

FIG. 1C is a cross-sectional side view of the IC of FIG. 1B during formation of a merging layer, in accordance with an embodiment.

FIG. 1D is a cross-sectional side view of the IC of FIG. 1C after further formation of the merging layer, in accordance with an embodiment.

FIG. 1E is a cross-sectional side view of the IC of FIG. 1D after removing the blocking layer and planarizing the merging layer, in accordance with an embodiment.

FIG. 1F is a cross-sectional side view of the IC of FIG. 1E after forming gate lines, in accordance with an embodiment.

FIGS. 2A-2L illustrate an IC fabrication process flow in accordance with another embodiment.

FIG. 2A is a cross-sectional perspective view of an IC configured in accordance with an embodiment.

FIG. 2B is a cross-sectional perspective view of the IC of FIG. 2A after forming a shallow trench isolation (STI) layer, in accordance with an embodiment.

FIG. 2C is a cross-sectional perspective view of the IC of FIG. 2B after planarizing the IC, in accordance with an embodiment.

FIG. 2D is a cross-sectional perspective view of the IC of FIG. 2C after recessing the STI layer, in accordance with an embodiment.

FIG. 2E is a cross-sectional perspective view of the IC of FIG. 2D after forming a blocking layer, in accordance with an embodiment.

FIG. 2F is a cross-sectional perspective view of the IC of FIG. 2E after patterning the blocking layer, in accordance with an embodiment.

FIG. 2G is a cross-sectional perspective view of the IC of FIG. 2F after forming a merging layer, in accordance with an embodiment.

FIG. 2H is a cross-sectional perspective view of the IC of FIG. 2G after removing the patterned blocking layer, in accordance with an embodiment.

FIG. 2I is a cross-sectional perspective view of the IC of FIG. 2H after forming a sacrificial layer, in accordance with an embodiment.

FIG. 2J is a cross-sectional perspective view of the IC of FIG. 2I after planarizing the IC, in accordance with an embodiment.

FIG. 2K is a cross-sectional perspective view of the IC of FIG. 2J after removing the planarized sacrificial layer, in accordance with an embodiment.

FIG. 2L is a cross-sectional perspective view of the IC of FIG. 2K after forming gates, in accordance with an embodiment.

Figure 1A:
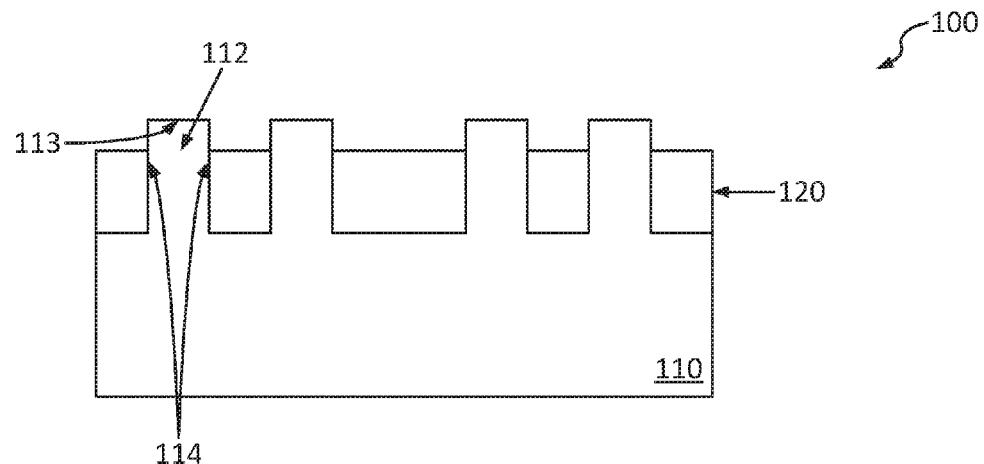
FIGS. 1A-1F illustrate an integrated circuit (IC) fabrication process flow in accordance with an embodiment.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines, right angles, etc., and some features may have surface topology or otherwise be non-smooth, given real world limitations of fabrication processes. In short, the figures are provided merely to show example structures.

DETAILED DESCRIPTION

Techniques are disclosed for forming a planar-like transistor device on a fin-based field-effect transistor (finFET) architecture during a finFET fabrication process flow. In some embodiments, the planar-like transistor can include, for example, a semiconductor layer which is grown to locally merge/bridge a plurality of adjacent fins of the finFET architecture and subsequently planarized to provide a high-quality planar surface on which the planar-like transistor can be formed. In some instances, the semiconductor merging layer can be a bridged-epi growth, for example, comprising epitaxial silicon. In some embodiments, such a planar-like device may assist, for example, with analog, high-voltage, wide-Z transistor fabrication. Also, provision of such a planar-like device during a finFET flow may allow for the formation of transistor devices, for example, exhibiting lower capacitance, wider Z, and/or fewer high electric field locations for improved high-voltage reliability, which may make such devices favorable for analog design, in some instances. Numerous configurations and variations will be apparent in light of this disclosure.

General Overview

As previously indicated, there are a number of non-trivial issues that can arise which complicate the ability to achieve scaled device features for analog designs. For instance, one non-trivial issue pertains to the fact that as complementary metal-oxide-semiconductor (CMOS) technology scales down to 22 nm and beyond, traditional planar transistor architectures will reach a fundamental limit for the required short channel control necessary, for instance, to continue scaling at the rate prescribed by Moore's Law. In recent times, tri-gate/fin-based field-effect transistor (finFET) architectures have been employed in CMOS technologies to provide better short-channel control and to enable process technologies to support simultaneous lower power/higher density transistors. Historically, while the digital transistor footprint has followed a consistent cadence of dimensional reduction, analog transistors have been unable to follow the same rate of scaling due to degradations in the analog characteristics of the transistor. Also, the figures of merit (FOMs) for an analog transistor greatly differ from those for a digital transistor; for example, output resistance, noise, cutoff frequencies $f_T/f_{MAX}$, and high voltage tolerance are a few FOMs that degrade as transistor geometries scale. Because of this, transistors with very long gate widths ('Z'), wide gate lengths, and thick oxides can be desirable to support high-voltage operation in combination with the standard digital offerings in a technology. However, due to the processing complexity of advanced technologies such as finFET architectures, it is very difficult to incorporate many of these process features that are beneficial for an analog design. Process and design rule restrictions prevent the construction of analog-favorable transistor architectures, and as a result, the FOMs for such analog devices will degrade with subsequent generations of process technologies.

Thus, and in accordance with an embodiment of the present disclosure, techniques are disclosed for forming a planar-like transistor device on a fin-based field-effect transistor (finFET) architecture during a finFET fabrication process flow. In some embodiments, a planar-like transistor formed using the disclosed techniques can include, for example, a semiconductor layer which is grown to locally merge/bridge a plurality of adjacent fins of the finFET architecture and subsequently planarized to provide a high-quality planar surface on which the planar-like transistor can be formed. In some instances, the semiconductor merging layer can be a bridged-epi growth, for example, comprising epitaxial silicon. In some embodiments, a planar-like device configured as described herein may assist, for example, with analog, high-voltage, wide-Z transistor fabrication. In some embodiments, both planar and fin-based devices are configured within a given IC to provide circuit designers with greater flexibility and choice. For instance, a designed could integrate such an IC into a circuit design and use the planar transistor in one aspect of the circuit design and the fin-based transistor in another aspect of the design.

In general, the techniques disclosed herein are primarily discussed, for example, in the context of forming a planar complementary metal-oxide-semiconductor (CMOS) transistor during a finFET fabrication flow which can be used, for instance, to produce tri-gate and/or other three-dimensional/non-planar transistor architectures, in accordance with some embodiments. It should be noted, however, that the disclosed techniques are not so limited, as in a more general sense, the disclosed techniques can be implemented, for example, with any standard and/or custom MOS/CMOS fin-based process flow, in other embodiments.

As will be appreciated in light of this disclosure, and in accordance with some embodiments, provision of such a planar-like device during a finFET flow may allow for the formation of transistor devices, for example, exhibiting lower capacitance, wider Z, and/or fewer corners (e.g., high electric field locations) for improved high-voltage reliability, which may make such devices favorable for analog design, in some instances. In some embodiments, architectures provided using the disclosed techniques may find use in any of a wide variety of applications, such as in system-on-chip (SoC) applications that could benefit from a transistor device having both planar and fin-based architecture. In a more general sense, the disclosed techniques and architecture can be used in any application which might benefit from the use of wide-Z transistor structures. Numerous suitable uses and applications will be apparent in light of this disclosure. Also, and in accordance with an embodiment, use of the disclosed techniques may be detected, for example, by visual or other inspection (e.g., microscope, etc.) of a given IC or other device that has a transistor architecture having a planar structure sitting atop or otherwise formed over a fin base configured as described herein.

Methodology and Architecture

FIGS. 1A-1F illustrate an integrated circuit (IC) fabrication process flow in accordance with an embodiment. Each of the views illustrated in FIGS. 1A-1F is taken along a cross-section that is substantially parallel to the gate. Turning now to the figures, the process flow begins as in FIG. 1A, which is a cross-sectional side view of an IC 100 configured in accordance with an embodiment. As can be seen, IC 100 includes a substrate 110. Substrate 110 can have any configuration and thickness that is suitable to serve, for example, as a foundation upon which a semiconductor device (e.g., a transistor) may be built. To that end, substrate 110 can be formed using any of a wide variety of processes, including: crystal growth; chemical vapor deposition (CVD); epitaxy; atomic layer deposition (ALD); and/or any combination thereof. Also, in some embodiments, substrate 110 can comprise any of a wide variety of materials, including: silicon (Si); germanium (Ge); a III-V material; and/or any other electrically conductive material suitable for forming a desired semiconductive channel for IC 100, as will be apparent in light of this disclosure. Other suitable materials, configurations, and techniques for forming providing substrate 110 will depend on a given application and will be apparent in light of this disclosure.

In any case, substrate 110 can include one or more bodies 112 which extend or otherwise protrude from the surface thereof above other portions/regions of IC 100 so as to generally take a fin-like shape (hereinafter generally referred to as fins 112). Formation/patterning of fins 112 can be done using typical finFET flow techniques, as will be apparent in light of this disclosure. As can be seen, a given fin 112 can include a top surface 113 and side walls 114. In some instances, a given fin 112 may be an integral portion or region of substrate 110; that is, a fin 112 may be formed from substrate 110 (e.g., substrate 110 and fin 112 are a continuous structure/layer). However, in some other instances, a given fin 112 may be a different layer from substrate 110 (e.g., substrate 110 and fin 112 are not a continuous structure/layer, as fin 112 is not formed from the same body as substrate 110). In any such case, fins 112 of IC 100 can be provided with any spacing/pitch, as desired for a given target application or end-use. It may be desirable, however, to ensure that the pitch is not so excessive as to prevent or otherwise hinder the ability to merge/bridge neighboring fins, for example, as discussed below in the context of FIG. 1D. Numerous configurations will be apparent in light of this disclosure.

Also, as can be seen from FIG. 1A, a shallow trench isolation (STI) layer 120 is provided over substrate 110. In accordance with an embodiment, STI layer 120 can be provided over substrate 110 with any desired initial thickness. To that end, STI layer 120 can be formed using any of a wide variety of techniques, including: high-density plasma (HDP) chemical vapor deposition (CVD); spin coating/spin-on deposition (SOD); and/or any combination thereof. Thereafter, and in accordance with an embodiment, the thickness of STI layer 120 can be reduced, for example, to the height of fins 112 (e.g., to top surface 113) using any suitable process, such as: chemical-mechanical planarization (CMP); an etch-back process; and/or any other suitable etch, polish, or clean process, as will be apparent in light of this disclosure. In some instances, the thickness of STI layer 120 can be further reduced, for example, to be recessed below the height of fins 112, thus partially exposing fins 112 (e.g., such that the thickness of STI layer 120 does not cover the top surface 113 and does not fully cover the side walls 114 of a given fin 112). To this end, and in accordance with an embodiment, any suitable wet and/or dry etch process can be used, as will be apparent in light of this disclosure. As will be further appreciated, the degree to which STI layer 120 is recessed can be customized, as desired. Also, in some embodiments, STI layer 120 can comprise, for example, an oxide such as silicon dioxide ($SiO_2$). However, STI layer 120 is not so limited in material composition, as in a more general sense, STI layer 120 may be any insulator material which provides the desired amount of electrical isolation for a given target application or end-use, as will be apparent in light of this disclosure. Other suitable materials, configurations, and techniques for providing and recessing STI layer 120 will depend on a given application and will be apparent in light of this disclosure.

Figure 1B:
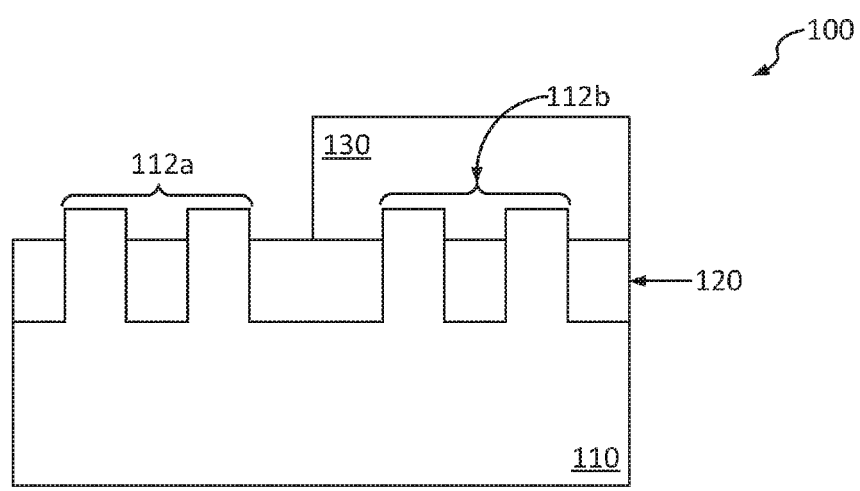

The process flow continues as in FIG. 1B, which is a cross-sectional side view of the IC 100 of FIG. 1A after forming blocking layer 130, in accordance with an embodiment. As can be seen, blocking layer 130 can be formed, for example, over a topography provided by a grouping of neighboring fins 112b and STI layer 120. In some embodiments, such as that illustrated by FIG. 1B, blocking layer 130 can be provided as a non-conformal layer having a thickness, for example, in the range of about 1-20 nm or greater. In some other embodiments, such as that discussed below in the context of FIG. 2E, blocking layer 130 can be provided as a substantially conformal layer having a thickness in the range of about 1-10 nm (e.g., in the range of about 5 nm±40%). In a more general sense, blocking layer 130 can have any configuration and thickness desired for a given target application or end-use. To that end, blocking layer 130 can be formed, for example, using atomic layer deposition (ALD) and/or any other suitable deposition process, as will be apparent in light of this disclosure.

In accordance with an embodiment, blocking layer 130 serves to protect the underlying fins 112b (e.g., which are to be utilized in forming a finFET device 180b, discussed below with reference to FIG. 1F) during formation of merging layer 140 (discussed below). To that end, blocking layer 130 can comprise, for example: an oxide such as silicon dioxide ($SiO_2$); a nitride such as silicon nitride ($Si_3N_4$); a resist material; and/or any other material which has sufficient resilience to protect the underlying fins 112b, as will be apparent in light of this disclosure. Other suitable configurations, materials, and techniques for forming blocking layer 130 will depend on a given application and will be apparent in light of this disclosure.

Figure 1C:
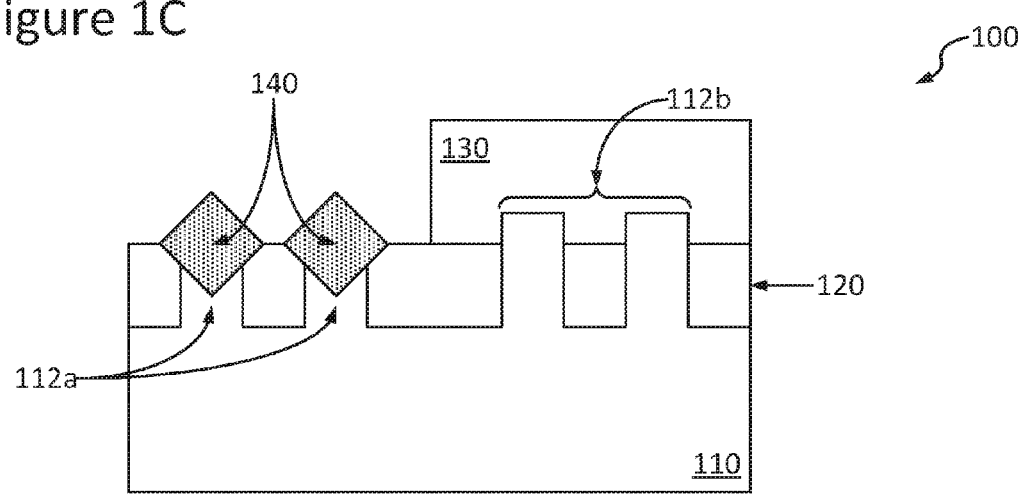

The process flow continues as in FIG. 1C, which is a cross-sectional side view of the IC 100 of FIG. 1B during formation of merging layer 140, in accordance with an embodiment. As can be seen, merging layer 140 can be selectively formed, for example, over a topography provided by a grouping of neighboring fins 112a and STI layer 120. As previously noted, blocking layer 130 can serve to protect the fins 112b, and thus, in accordance with an embodiment, may aid in ensuring that merging layer 140 is selectively formed only over the desired fins 112a (e.g., which are to be utilized in forming a planar device 180a, discussed below with reference to FIG. 1F) and not over fins 112b.

Merging layer 140 can have any initial configuration and dimensions, as desired for a given target application or end-use. However, it may be desirable to ensure that the initial configuration/dimensions of merging layer 140 are sufficient, for example, to allow for the growth from adjacent or otherwise neighboring fins 112a to achieve a desired degree of merging/bridging, as discussed below with reference to FIG. 1D. To that end, merging layer 140 can be formed using any of a wide variety of processes, including: chemical vapor deposition (CVD); epitaxy, such as metalorganic vapor phase epitaxy (MOVPE) or molecular beam epitaxy (MBE); atomic layer deposition (ALD); and/or any combination thereof. Also, in some embodiments, merging layer 140 can comprise, for example: silicon (Si); silicon germanium (SiGe); silicon carbide (SiC); and/or any other semiconductor material which provides the desired merging/bridging of fins 112a, as will be apparent in light of this disclosure. Other suitable materials, initial configurations, and techniques for forming merging layer 140 will depend on a given application and will be apparent in light of this disclosure.

Figure 1D:
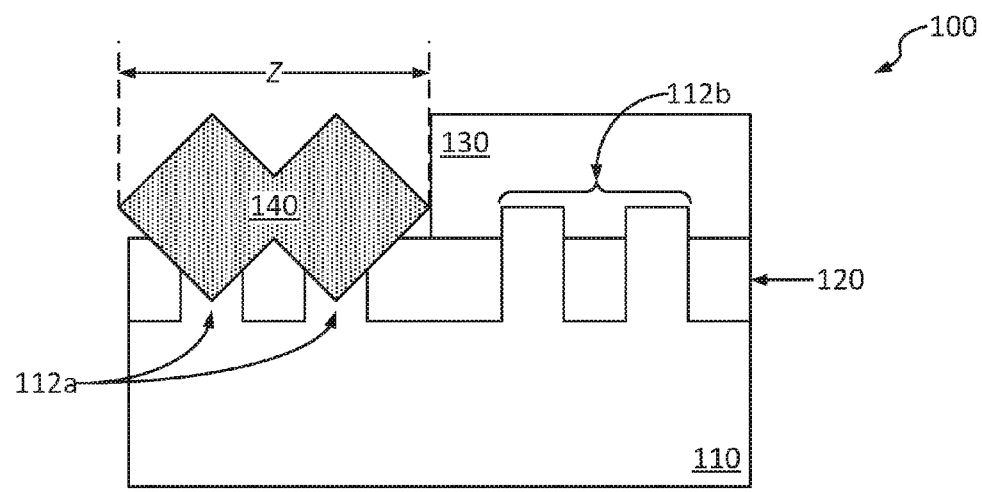

The process flow continues as in FIG. 1D, which is a cross-sectional side view of the IC 100 of FIG. 1C after further formation of merging layer 140, in accordance with an embodiment. As can be seen, growth of merging layer 140 can be continued, for example, to merge the growth from adjacent or otherwise neighboring fins 112a, thus bridging together those fins 112a. It may be desirable to continue growing merging layer 140, for instance, to ensure that the final configuration/dimensions of merging layer 140 (e.g., before planarization to provide planarized merging layer 140') are sufficient: to allow for the desired degree of planarization of merging layer 140; to avoid shorting out or other unwanted encroachment of an adjacent device (e.g., finFET device 180b); and/or to avoid inducing dislocations or other unwanted stresses/defects in merging layer 140. In some embodiments, merging layer 140 may have a Z width that is in the range of about 100-200 nm (e.g., in the range of about 100-120 nm, about 120-140 nm, about 140-160 nm, about 160-180 nm, about 180-200 nm, or any other sub-range that is in the range of about 100-200 nm). In some other embodiments, merging layer 140 may have a Z width that is in the range of about 200-300 nm (e.g., in the range of about 200-220 nm, about 220-240 nm, about 240-260 nm, about 260-280 nm, about 280-300 nm, or any other sub-range that is in the range of about 200-300 nm). In a more general sense, the Z width of merging layer 140 can be customized, as desired for a given target application or end-use.

Figure 1E:
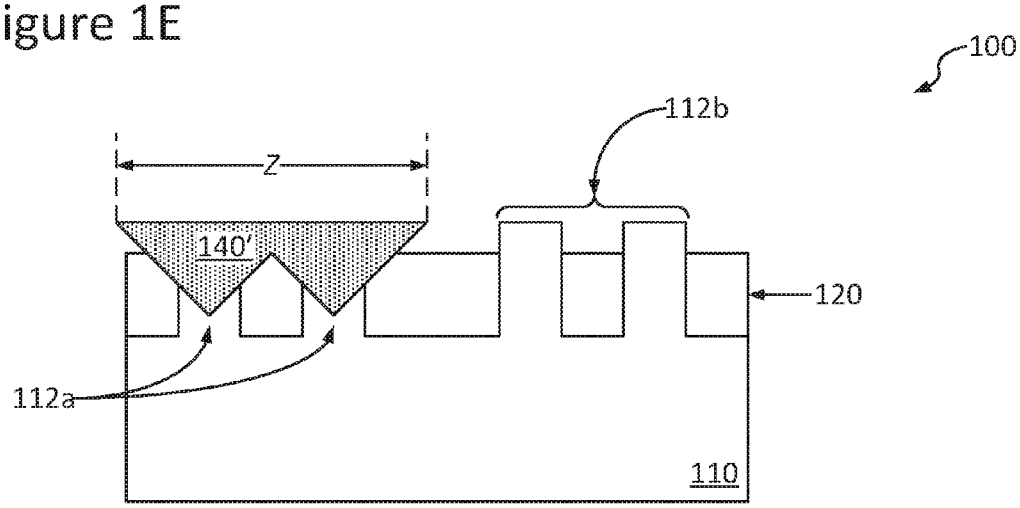

The process flow continues as in FIG. 1E, which is a cross-sectional side view of the IC 100 of FIG. 1D after removing blocking layer 130 and planarizing merging layer 140, in accordance with an embodiment. After forming merging layer 140, blocking layer 130 can be removed from IC 100 using any of a wide range of techniques, and, as will be appreciated in light of this disclosure, the selected process (es) may depend, at least in part, on the material composition of blocking layer 130 and/or other layers of IC 100. For instance, in some cases in which blocking layer 130 comprises an oxide, a wet etch using a hydrofluoric acid (HF)- based etch chemistry can be used. In some other cases in which blocking layer 130 comprises a metal oxide, a wet etch using a sulfuric acid ($H_2SO_4$)-based etch chemistry can be used. In some still other cases in which blocking layer 130 comprises a resist material, an oxygen ($O_2$)-based dry ash and clean can be used. Other suitable techniques for removing blocking layer 130 will depend on a given application and will be apparent in light of this disclosure.

Thereafter, and in accordance with some embodiments, merging layer 140 can be planarized to provide a merging layer 140' having a substantially flat/planar surface. Planarization of merging layer 140 can be performed, for example, using: a chemical-mechanical planarization (CMP) process; an etch-back process; any combination thereof; and/or any other suitable planarization, polishing, or etching process, as will be apparent in light of this disclosure. It may be desirable to planarize merging layer 140', for example, until the height of neighboring fins 112b is reached (e.g., to avoid inadvertently reducing the height of fins 112b). In accordance with an embodiment, planarized merging layer 140' provides a planar topography which can be utilized, for example, in forming a planar-like device 180a (discussed below). Thus, in this sense, this area of IC 100 that includes fins 112a which are merged/bridged by planarized merging layer 140' may be referred to as a planar-designated region of IC 100. Other suitable techniques for providing planarized merging layer 140' will depend on a given application and will be apparent in light of this disclosure.

Figure 1F:
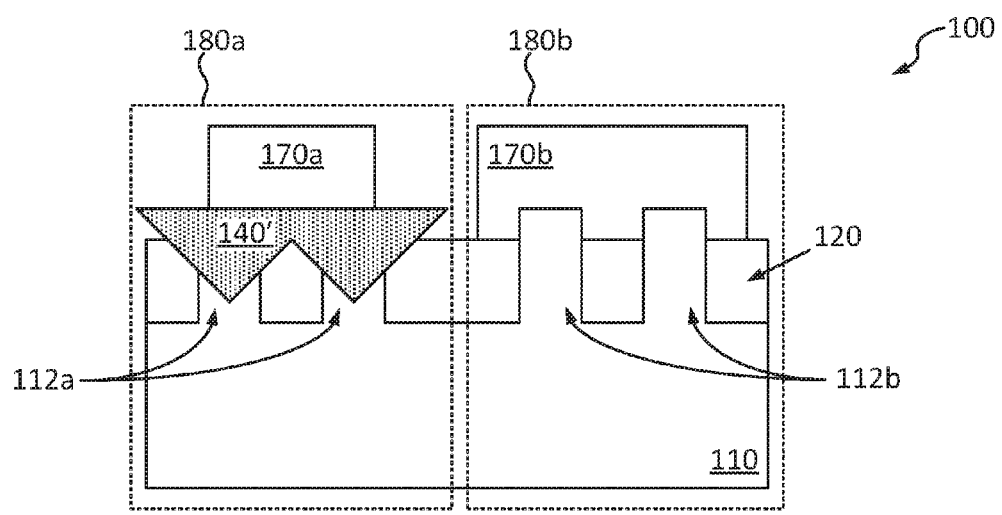

The process flow continues as in FIG. 1F, which is a cross-sectional side view of the IC 100 of FIG. 1E after forming gate lines 170a and 170b, in accordance with an embodiment. As can be seen, a gate line 170a can be patterned over planarized merging layer 140' (e.g., can be formed in a planar-designated region of IC 100), thus providing a planar-like device 180a, in accordance with an embodiment. As can further be seen, a gate line 170b can be patterned over fins 112b (e.g., can be formed in a standard finFET region of IC 100), thus providing a standard finFET device 180b, in accordance with an embodiment. As will be apparent in light of this disclosure, patterning of gate lines 170a/170b can be provided using any standard lithography technique, and in some instances gate lines 170a and 170b can be patterned simultaneously. Also, in some embodiments, a given gate line 170a/170b can comprise any of a wide range of materials, including: tungsten (W); aluminum (Al); titanium (Ti); copper (Cu); any alloy thereof; polysilicon (doped or undoped); and/or any other suitable gate electrode material, as will be apparent in light of this disclosure. Other suitable configurations, materials, and techniques for forming gate lines 170a/170b will depend on a given application and will be apparent in light of this disclosure.

As can be seen, the process flow of FIGS. 1A-1F can be used, in accordance with some embodiments, to simultaneously provide a standard finFET device 180b as well as a planar-like transistor device 180a during a finFET flow. Also, as previously noted, and in accordance with an embodiment, the gate width Z can be customized as desired for a given target application or end-use. It should be noted, however, that the present disclosure is not intended to be limited to the example configurations of devices 180a and 180b illustrated in FIG. 1F, and numerous other suitable configurations will be apparent in light of this disclosure.

FIGS. 2A-2L illustrate an integrated circuit (IC) fabrication process flow in accordance with another embodiment. Each of the views illustrated in FIGS. 2A-2L is taken along a cross-section that is substantially parallel to the gate. Turning now to these figures, the process flow begins as in FIG. 2A, which is a cross-sectional perspective view of an IC 200 configured in accordance with an embodiment. As can be seen, IC 200 includes a substrate 210 having a plurality of fins 212, including a first sub-set 212a and a second sub-set 212b. As will be appreciated in light of this disclosure, the discussion provided above with regard to suitable configurations, materials, and/or formation techniques for substrate 110 and fin sub-sets 112a/112b can be applied equally here in the context of substrate 210 and fins 212a/212b, in accordance with one or more embodiments. Also, in some instances, a buffering layer 214 of an oxide material and/or a hardmask layer 216 of a nitride material may be located over the one or more fins 212, for example, as a result of the patterning process(es) used to pattern those fins 212. Numerous configurations will be apparent in light of this disclosure.

Figure 2A:
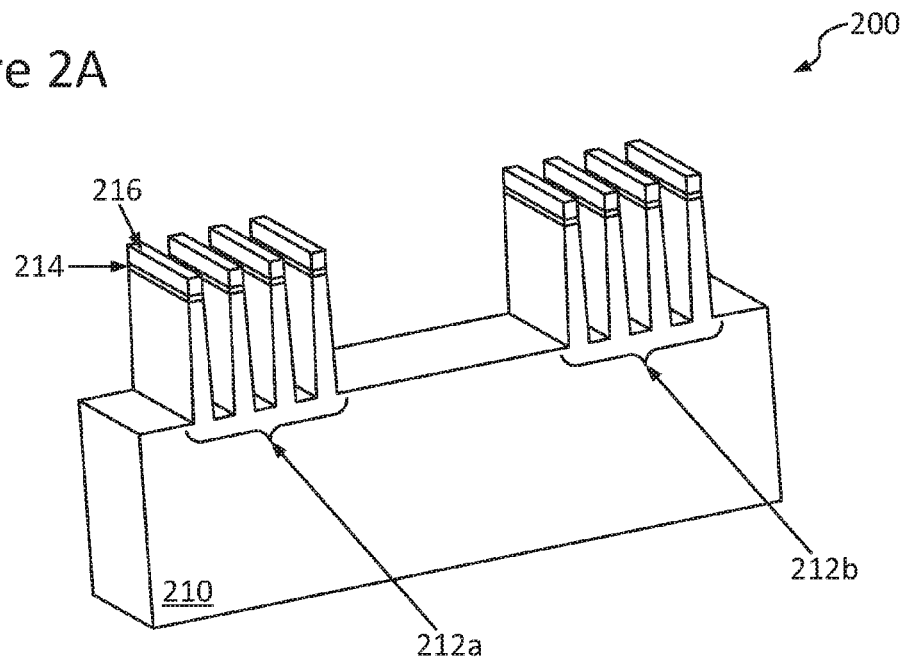
Figure 2B:
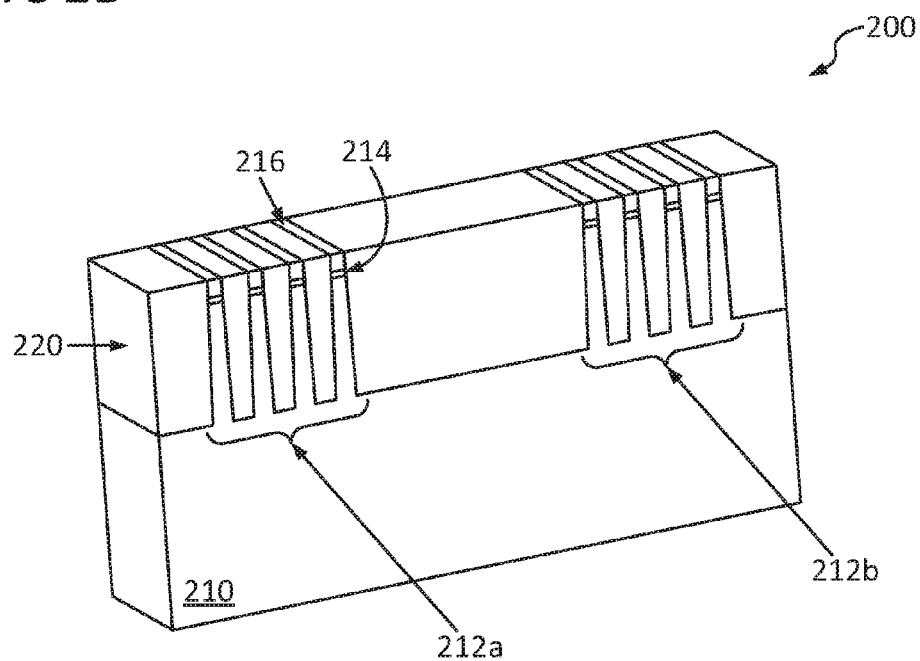

The process flow continues as in FIG. 2B, which is a cross-sectional perspective view of the IC 200 of FIG. 2A after forming a shallow trench isolation (STI) layer 220, in accordance with an embodiment. As will be appreciated in light of this disclosure, the discussion provided above with regard to suitable configurations, materials, and/or formation techniques for STI layer 120 can be applied equally here in the context of STI layer 220, in accordance with one or more embodiments. In some instances, STI layer 120 may be deposited with an initial thickness, for example, which extends beyond the height of fins 212 (e.g., to the height of hardmask layer 216).

Figure 2C:
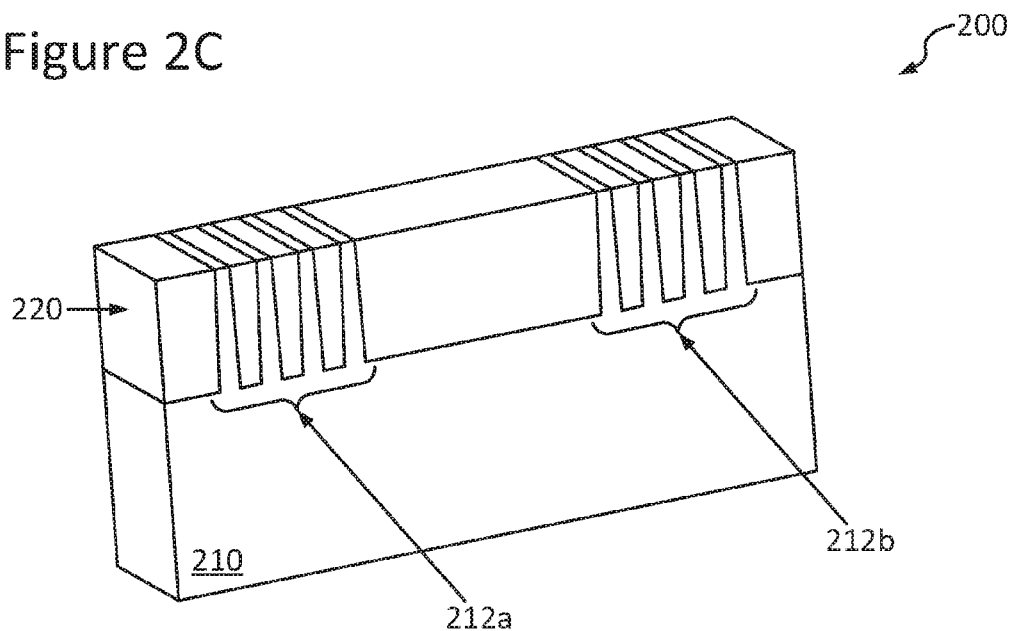

Next, the process flow continues as in FIG. 2C, which is a cross-sectional perspective view of the IC 200 of FIG. 2B after planarizing IC 200, in accordance with an embodiment. As can be seen, STI layer 220 can be planarized, for example, to the height of fins 212a/212b, thereby removing hardmask layer 216 and buffer layer 214. Thereafter, the process flow continues as in FIG. 2D, which is a cross-sectional perspective view of the IC 200 of FIG. 2C after recessing STI layer 220, in accordance with an embodiment. As can be seen, STI layer 220 can be recessed to partially expose fins 212a/212b (e.g., such that the thickness of STI layer 220 does not cover the top surface and does not fully cover the side walls of a given fin 212). As will be appreciated in light of this disclosure, the discussion provided above with regard to suitable techniques for reducing the thickness of STI layer 120 (e.g., planarization, etch-back, etc.) can be applied equally here in the context of STI layer 220, in accordance with one or more embodiments.

Figure 2D:
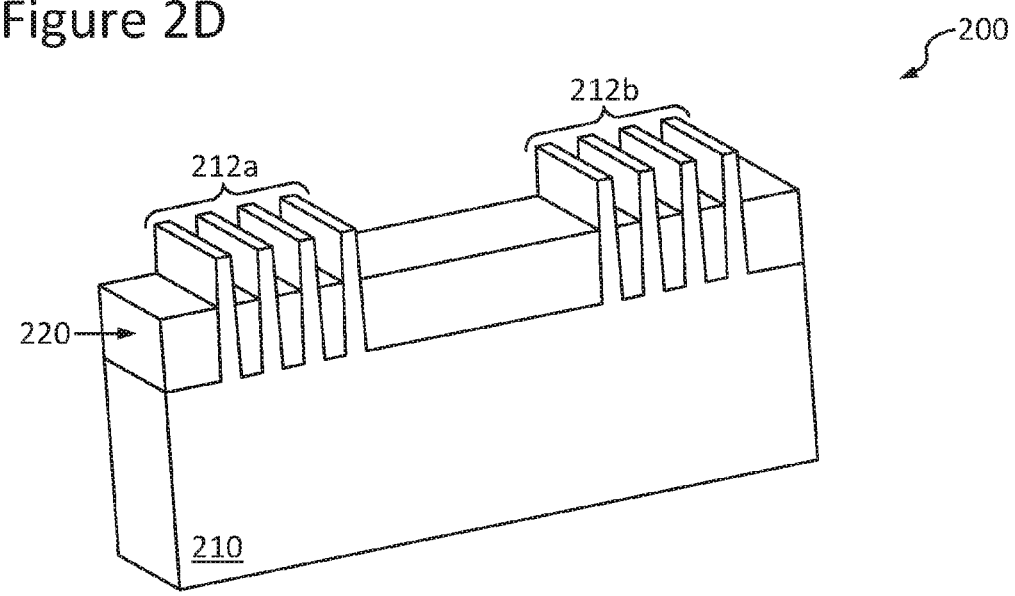
Figure 2E:
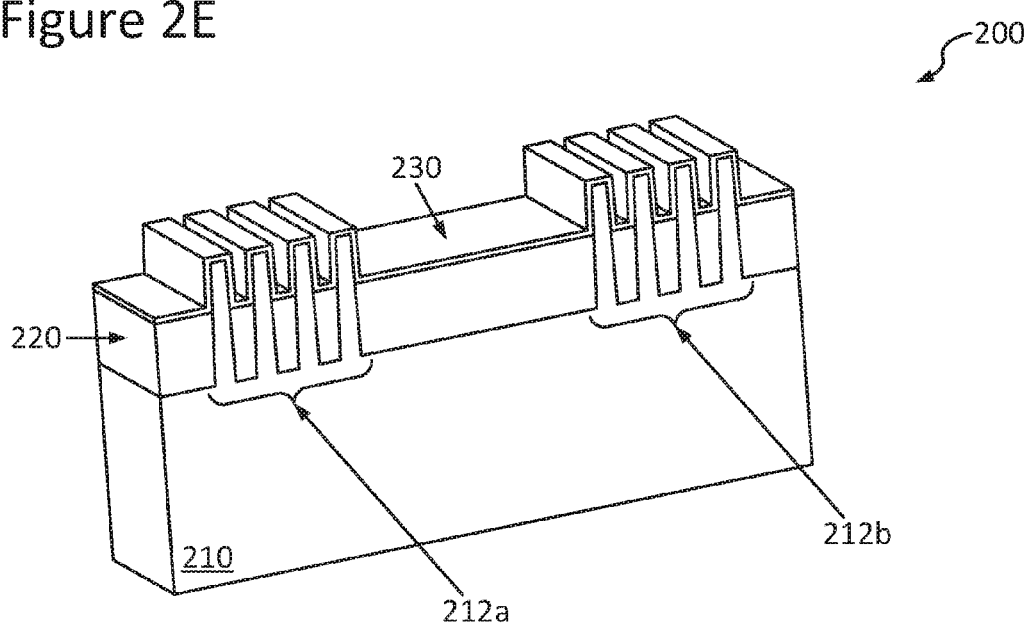

The process flow continues as in FIG. 2E, which is a cross-sectional perspective view of the IC 200 of FIG. 2D after forming blocking layer 230, in accordance with an embodiment. As can be seen, blocking layer 230 can be formed over the topography provided by STI layer 220 and fins 212a/212b, and in some instances may be substantially conformal to such topography. As will be further appreciated in light of this disclosure, the discussion provided above with regard to suitable configurations, materials, and/or formation techniques for blocking layer 130 can be applied equally here in the context of blocking layer 230. It may be desirable, in some cases, to ensure that the thickness of blocking layer 230 is: sufficiently thick to avoid holes therein and unwanted growth regions; and/or not so excessively thick as to occlude the spacing between any two adjacent fins 212. Thereafter, the process flow continues as in FIG. 2F, which is a cross-sectional perspective view of the IC 200 of FIG. 2E after patterning blocking layer 230, in accordance with an embodiment. As can be seen, blocking layer 230 can be partially removed, thereby exposing the underlying fins 212a which are to be utilized in the planar-like device 280a (discussed below). The remaining patterned blocking layer 230' is located over the fins 212b which are to be utilized in finFET device 280b (discussed below). Thus, in a sense, blocking layer 230/230' can serve as a sacrificial patterning layer. In accordance with an embodiment, patterning of blocking layer 230 to provide patterned blocking layer 230' can be done using any standard lithography and etching process(es).

Figure 2F:
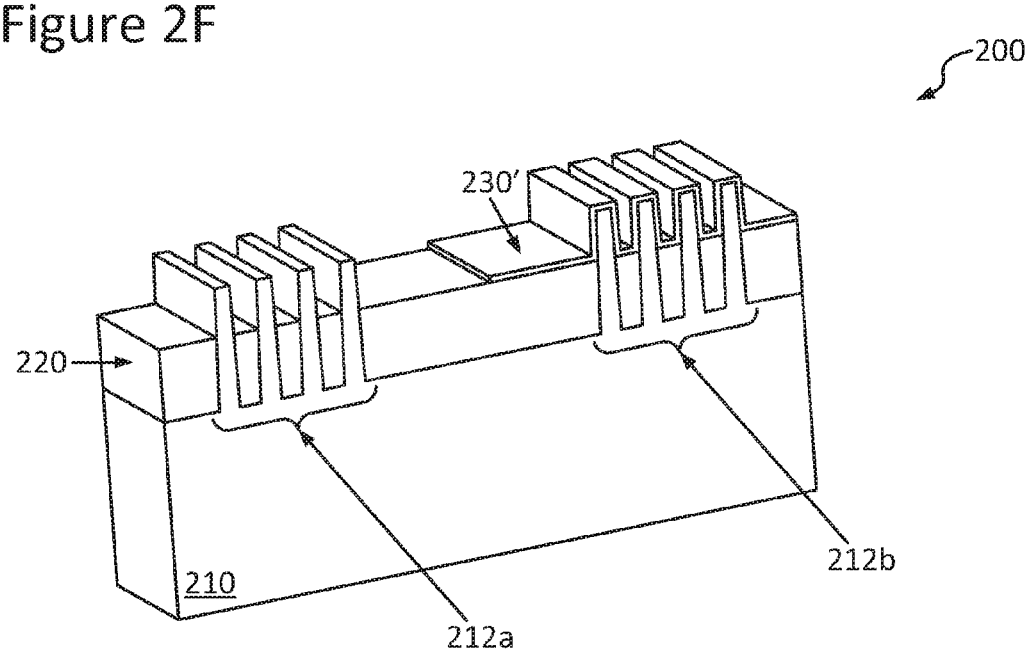
Figure 2G:
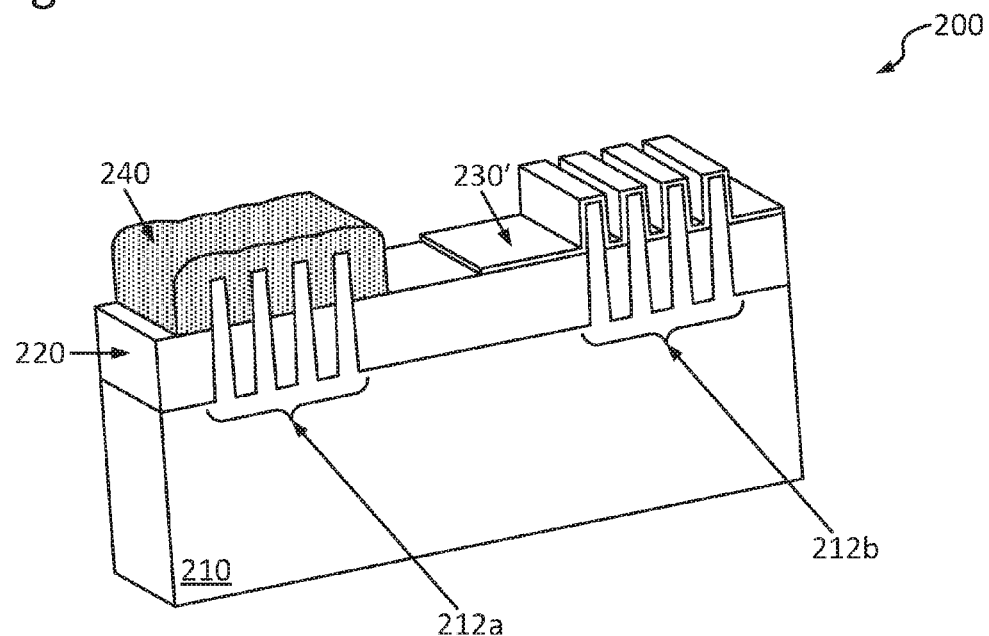

The process flow continues as in FIG. 2G, which is a cross-sectional perspective view of the IC 200 of FIG. 2F after forming merging layer 240, in accordance with an embodiment. As can be seen, merging layer 240 can be selectively formed over fins 212a; this may be aided, for example, by the inclusion of patterned blocking layer 230' over fins 212b. As will be appreciated in light of this disclosure, the discussion provided above with regard to suitable configurations, materials, and/or formation techniques for merging layer 140 can be applied equally here in the context of merging layer 240, in accordance with one or more embodiments. Thereafter, the process flow continues as in FIG. 2H, which is a cross-sectional perspective view of the IC 200 of FIG. 2G after removing patterned blocking layer 230', in accordance with an embodiment. As can be seen, removal of patterned blocking layer 230' exposes the underlying fins 212b which it protects during growth of merging layer 240. As will be further appreciated, the discussion provided above with regard to suitable techniques for removing blocking layer 130 can be applied equally here in the context of patterned blocking layer 230', in accordance with one or more embodiments.

Figure 2H:
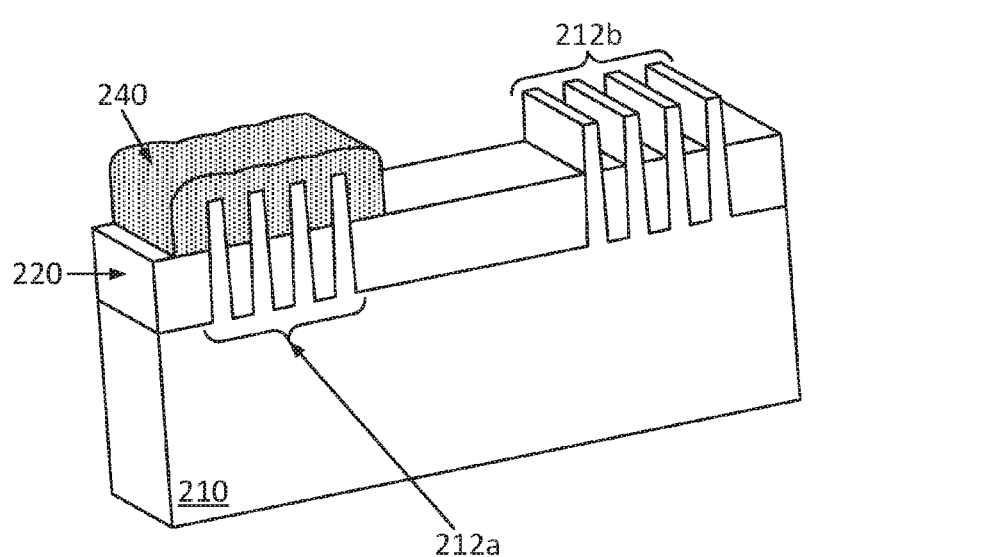
Figure 2I:
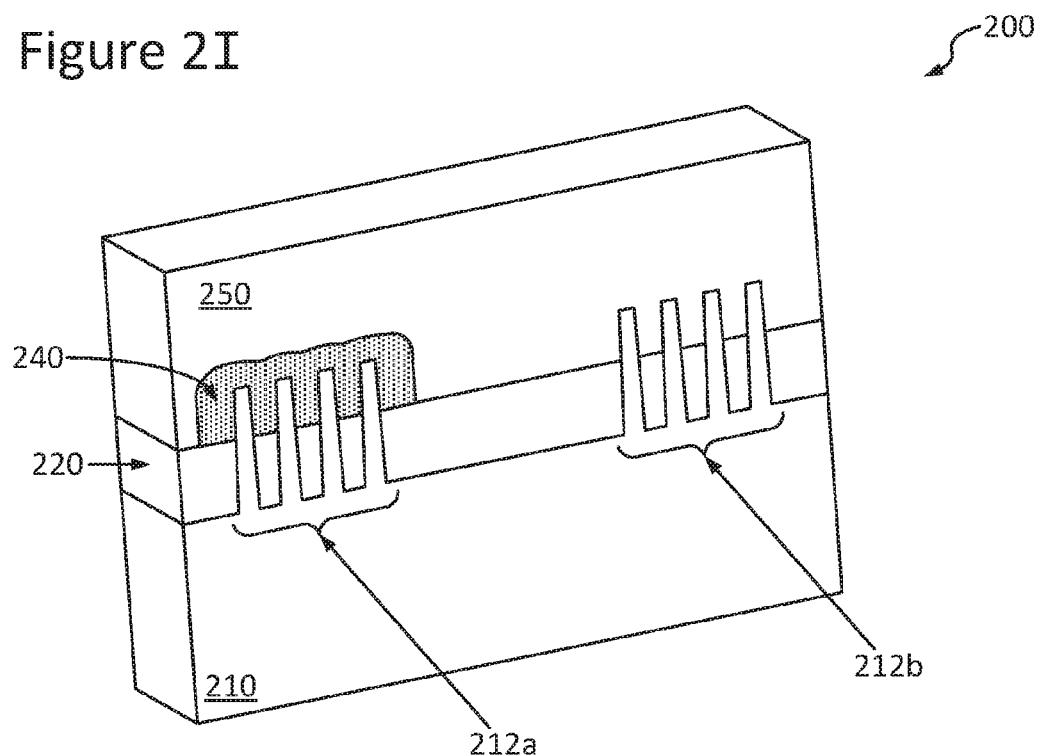

The process flow continues as in FIG. 2I, which is a cross-sectional perspective view of the IC 200 of FIG. 2H after forming sacrificial layer 250, in accordance with an embodiment. As can be seen, sacrificial layer 250 can be formed, for example, over the topography provided by STI layer 220, merging layer 240, and fins 212b. Sacrificial layer 250 can be provided with any desired thickness. It may be desirable, for example, to ensure that sacrificial layer 250 has sufficient thickness to exceed the height of merging layer 240. To that end, sacrificial layer 250 can be formed using any of a wide variety of techniques, including: high-density plasma (HDP) chemical vapor deposition (CVD); spin coating/spin-on deposition (SOD); and/or any combination thereof. In some embodiments, sacrificial layer 250 can comprise, for example: an oxide such as silicon dioxide (SiO$_2$); an ash-able hardmask material such as a carbon (C)-based resist; any hybrid/combination thereof; and/or any other material which can serve as a suitable sacrificial polish layer, as will be apparent in light of this disclosure. Other suitable configurations, materials, and techniques for forming sacrificial layer 250 will depend on a given application and will be apparent in light of this disclosure.

Figure 2J:
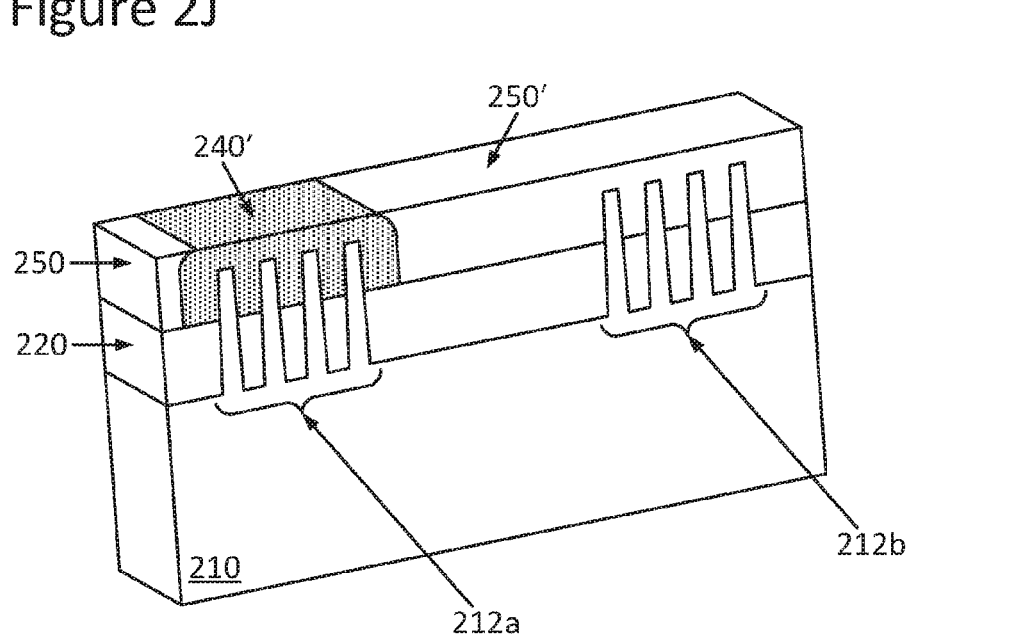

Next, the process flow continues as in FIG. 2J, which is a cross-sectional perspective view of the IC 200 of FIG. 2I after planarizing IC 200, in accordance with an embodiment. As can be seen, planarization of IC 200 can be performed, for instance, to reduce the thickness of sacrificial layer 250 and merging layer 240, thereby producing a planarized sacrificial layer 250' and planarized merging layer 240'. Planarization can continue, for example, until merging layer 240' and sacrificial layer 250' extend above the height of fins 212a and 212b, respectively, by a given target distance, which can be customized as desired for a given application or end-use. In any case, it may be desirable to ensure that continued planarization of merging layer 240' and sacrificial layer 250' is not so excessive as to inadvertently reduce the height of underlying fins 212a/212b. To that end, any of a wide variety of techniques can be used, including: chemical-mechanical planarization (CMP); an etch process having an etch selectivity, for example, to oxides; a non-selective etch process which is made to stop above the height of fins 212a/212b; and/or any combination thereof. Other suitable configurations and techniques for planarizing merging layer 240' and sacrificial layer 250' will depend on a given application and will be apparent in light of this disclosure.

Thereafter, the process flow continues as in FIG. 2K, which is a cross-sectional perspective view of the IC 200 of FIG. 2J after removing planarized sacrificial layer 250', in accordance with an embodiment. As will be appreciated in light of this disclosure, the process(es) used for removing sacrificial layer 250' may depend, at least in part, on the material composition of sacrificial layer 250' and/or other layers of IC 100. For instance, in some cases in which sacrificial layer 250' comprises an oxide, any suitable wet and/or dry etch process can be used, as will be apparent in light of this disclosure. In some other cases in which sacrificial layer 250' comprises a carbon (C)-based resist or a hybrid of an oxide and a C-based material, any suitable ash and clean process can be used, as will be apparent in light of this disclosure. In any case, removal of planar sacrificial layer 250' exposes the underlying fins 212b, while planar merging layer 240' remains intact over fins 212a. As previously noted, and in accordance with some embodiments, the dimensions of planar merging layer 240' can be customized to provide any desired gate width Z.

The process flow continues as in FIG. 2L, which is a cross-sectional perspective view of the IC 200 of FIG. 2K after forming gates 270a and 270b, in accordance with an embodiment. As can be seen, gate electrodes 270a can be patterned over planarized merging layer 240', thus providing a planar-like device 280a, in accordance with an embodiment. As can further be seen, gate electrodes 270b can be patterned over fins 212b, thus providing a standard finFET device 280b, in accordance with an embodiment. As will be apparent in light of this disclosure, patterning of gates 270a/270b can be provided using any standard lithography technique, and in some instances gates 270a and 270b can be patterned simultaneously. In some instances, a hardmask layer 275a/275b comprising, for example, a nitride such as silicon nitride (Si$_3$N$_4$) may be present over gates 270a/270b. As will be further appreciated, the discussion provided above with regard to suitable configurations, materials, and/or formation techniques for gate lines 170a/170b can be applied equally here in the context of gates 270a/270b, in accordance with one or more embodiments. Additional and/or different downstream processing may be provided, in accordance with some other embodiments, and numerous suitable configurations for device 280a and/or device 280b will be apparent in light of this disclosure.

Figure 3A:
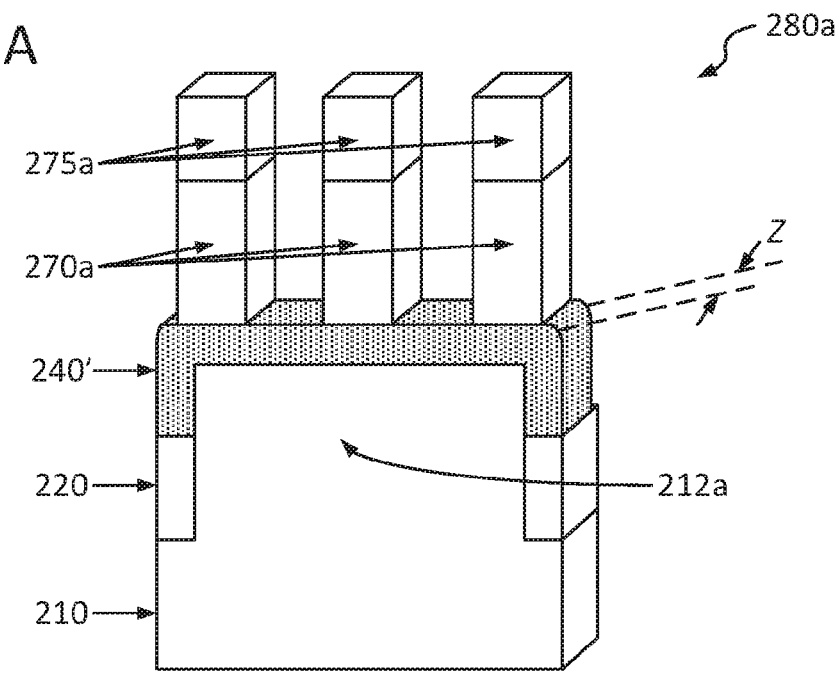
FIGS. 3A and 3B are cross-sectional perspective views of the IC devices of FIG. 2L, in accordance with an embodiment.
Figure 3B:
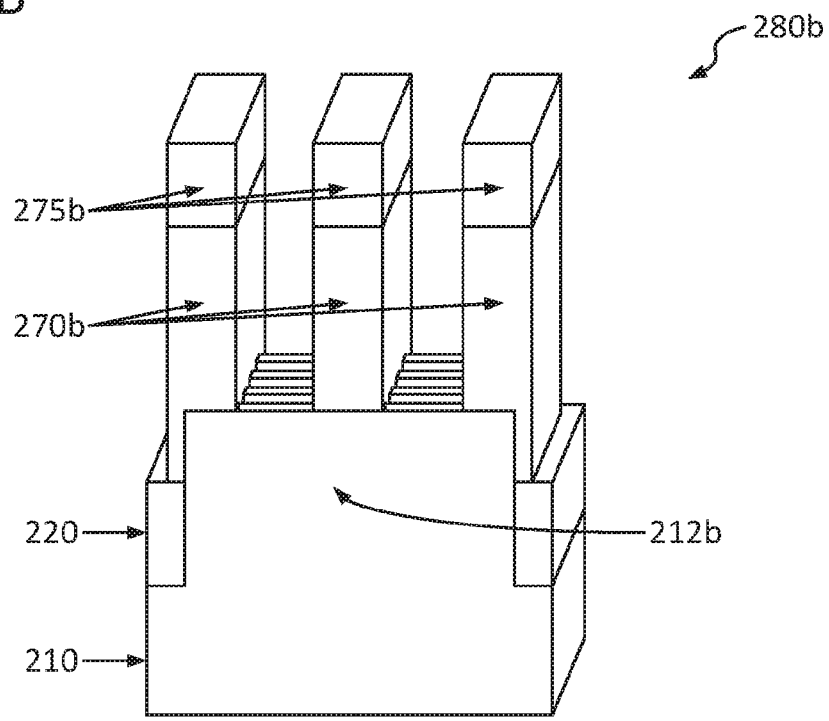

FIGS. 3A and 3B are cross-sectional perspective views of the devices 280a and 280b, respectively, of FIG. 2L, in accordance with an embodiment. Each of the views illustrated in FIGS. 3A-3B is taken along a cross-section that is substantially orthogonal to the gate (e.g., an OGD cut). As can be seen, the process flow of FIGS. 2A-2L can be used, in accordance with some embodiments, to simultaneously provide a standard finFET device 280b as well as a planar-like transistor device 280a during a finFET flow. Also, as previously noted, and in accordance with an embodiment, the gate width Z can be customized as desired for a given target application or end-use. It should be noted, however, that the present disclosure is not intended to be limited to the example configurations of devices 280a and 280b illustrated in FIGS. 3A and 3B, and numerous other suitable configurations will be apparent in light of this disclosure.

Example System

Figure 4:
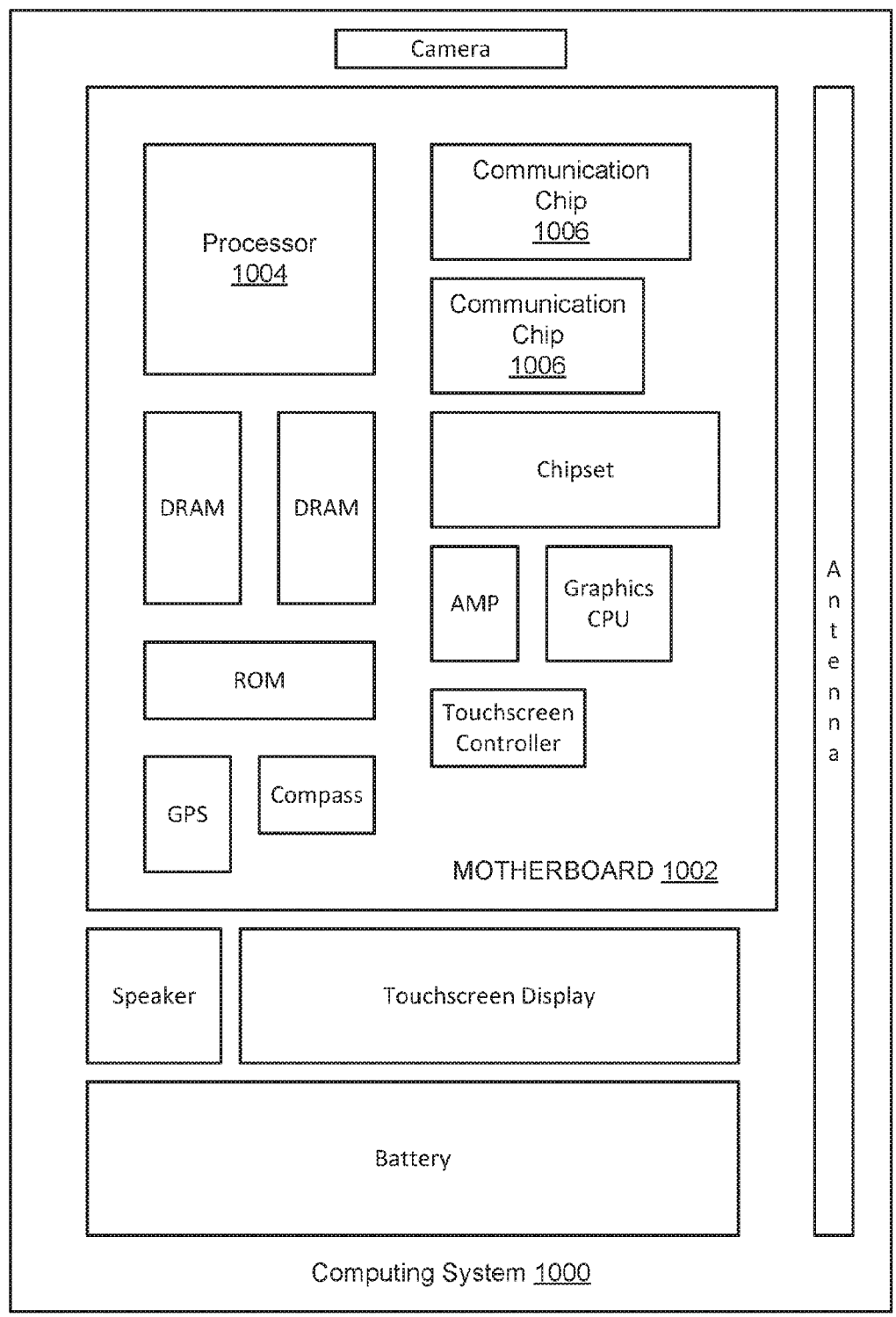
FIG. 4 illustrates a computing system implemented with IC structures or devices formed using the disclosed techniques in accordance with an example embodiment.

FIG. 4 illustrates a computing system 1000 implemented with integrated circuit structures or devices formed using the disclosed techniques in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc. Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is an integrated circuit comprising: a semiconductor substrate patterned with a plurality of fins extending from a surface thereof; an isolation layer formed over the semiconductor substrate, the isolation layer having a thickness that is less than a height of the plurality of fins; a semiconductor body formed over a first sub-set of the plurality of fins and having a planar surface, wherein the semiconductor body merges the first sub-set of fins; and a first gate body formed over the planar surface of the semiconductor body.

Example 2 includes the subject matter of any of Examples 1 and 4 through 11, wherein the plurality of fins are formed from the semiconductor substrate.

Example 3 includes the subject matter of any of Examples 1 and 4 through 11, wherein the semiconductor substrate and the plurality of fins are distinct layers.

Example 4 includes the subject matter of any of Examples 1 through 3 and 6 through 11, wherein the semiconductor body comprises at least one of silicon (Si), silicon germanium (SiGe), and/or silicon carbide (SiC).

Example 5 includes the subject matter of any of Examples 1 through 3 and 6 through 11, wherein the semiconductor body comprises epitaxial silicon (Si).

Example 6 includes the subject matter of any of Examples 1 through 5 and 7 through 11, wherein the isolation layer comprises silicon dioxide ($SiO_2$).

Example 7 includes the subject matter of any of Examples 1 through 6 and 8 through 11, wherein the first gate body comprises at least one of tungsten (W), aluminum (Al), titanium (Ti), copper (Cu), any alloy thereof, and/or polysilicon.

Example 8 includes the subject matter of any of Examples 1 through 7 and 9 through 11 and further comprises a second gate body formed over a second sub-set of the plurality of fins, wherein the first and second sub-sets of fins are adjacent to one another, and wherein the first and second gate bodies are electrically isolated from one another.

Example 9 includes the subject matter of Example 8, wherein the second gate body comprises at least one of tungsten (W), aluminum (Al), titanium (Ti), copper (Cu), any alloy thereof, and/or polysilicon.

Example 10 includes the subject matter of any of Examples 1 through 9, wherein the integrated circuit has a Z width in the range of about 100-200 nm.

Example 11 includes the subject matter of any of Examples 1 through 9, wherein the integrated circuit has a Z width in the range of about 200-300 nm.

Example 12 includes the subject matter of any of Examples 1 through 11, wherein the integrated circuit comprises a planar metal-oxide-semiconductor field-effect transistor (MOSFET).

Example 13 includes the subject matter of any of Examples 1 through 11, wherein the integrated circuit exhibits at least one of improved capacitance and/or improved high voltage reliability.

Example 14 is a system-on-chip (SoC) comprising the integrated circuit of any of Examples 1 through 11.

Example 15 is an analog circuit comprising the integrated circuit of any of Examples 1 through 11.

Example 16 is a method of forming an integrated circuit, the method comprising: forming an isolation layer over a semiconductor substrate patterned with a plurality of fins extending from a surface thereof, the isolation layer having a thickness that is less than a height of the plurality of fins; forming a semiconductor layer over a first sub-set of the plurality of fins, wherein the semiconductor layer has a planar surface and merges the first sub-set of fins; and forming a first gate body over the planar surface of the semiconductor layer.

Example 17 includes the subject matter of any of Examples 16 and 19 through 30, wherein the plurality of fins are formed from the semiconductor substrate.

Example 18 includes the subject matter of any of Examples 16 and 19 through 30, wherein the semiconductor substrate and the plurality of fins are distinct layers.

Example 19 includes the subject matter of any of Examples 16 through 18 and 20 through 30, wherein forming the isolation layer over the semiconductor substrate comprises: depositing the isolation layer over the semiconductor substrate; planarizing the isolation layer to reduce its thickness to the height of the plurality of fins; and etching the isolation layer to reduce its thickness to less than the height of the plurality of fins.

Example 20 includes the subject matter of any of Examples 16 through 19 and 21 through 30, wherein forming the isolation layer over the semiconductor substrate comprises using at least one of a high-density plasma (HDP) chemical vapor deposition (CVD) process, a spin coating/spin-on deposition (SOD) process, and/or any combination thereof.

Example 21 includes the subject matter of any of Examples 16 through 20 and 22 through 30, wherein forming the semiconductor layer over the first sub-set of fins comprises using at least one of a chemical vapor deposition (CVD) process, a metalorganic vapor phase epitaxy (MOVPE) process, a molecular beam epitaxy (MBE) process, an atomic layer deposition (ALD) process, and/or any combination thereof.

Example 22 includes the subject matter of any of Examples 16 through 21 and 23 through 30, wherein forming the semiconductor layer over the first sub-set of fins comprises: depositing the semiconductor layer over the first sub-set of fins; and planarizing the semiconductor layer to provide the planar surface.

Example 23 includes the subject matter of Example 22, wherein planarizing the semiconductor layer comprises using at least one of a chemical-mechanical planarization (CMP) process, an etch-back process, and/or any combination thereof.

Example 24 includes the subject matter of Example 22, wherein before depositing the semiconductor layer over the first sub-set of fins, forming the semiconductor layer over the first sub-set of fins further comprises: forming a blocking layer over the second sub-set of fins, wherein the blocking layer protects the second sub-set of fins during depositing the semiconductor layer over the first sub-set of fins.

Example 25 includes the subject matter of Example 24, wherein the blocking layer comprises at least one of silicon dioxide ($SiO_2$), silicon nitride ($Si_3N_4$), and/or a resist material.

Example 26 includes the subject matter of Example 24, wherein forming the blocking layer over the second sub-set of fins comprises using an atomic layer deposition (ALD) process.

Example 27 includes the subject matter of Example 24, wherein forming the blocking layer over the second sub-set of fins comprises: depositing the blocking layer over a topography provided by the isolation layer and the plurality of fins; and removing the blocking layer where it covers the first sub-set of fins.

Example 28 includes the subject matter of Example 27, wherein removing the blocking layer where it covers the first sub-set of fins comprises using a wet etch process utilizing a hydrofluoric acid (HF)-based etch chemistry, a wet etch process utilizing a sulfuric acid ($H_2SO_4$)-based etch chemistry, and/or an oxygen ($O_2$)-based dry ash and clean process.

Example 29 includes the subject matter of any of Examples 16 through 28 and 30 and further comprises forming a second gate body over a second sub-set of the plurality of fins, wherein the first and second sub-sets of fins are adjacent to one another, and wherein the first and second gate bodies are electrically isolated from one another.

Example 30 includes the subject matter of any of Examples 16 through 29, wherein the first and second gate bodies are formed simultaneously.

Example 31 is a metal-oxide-semiconductor (MOS) process flow comprising the method of any of Examples 16 through 30.

Example 32 is a transistor architecture formed by the process flow of Example 31.

Example 33 is a complementary metal-oxide-semiconductor (CMOS) process flow comprising the method of any of Examples 16 through 30.

Example 34 is a transistor architecture formed by the process flow of Example 33.

Example 35 is an integrated circuit formed by the method of any of Examples 16 through 30.

Example 36 is a system-on-chip (SoC) comprising the integrated circuit of Example 35.

Example 37 is a transistor architecture comprising: a semiconductor substrate having first and second sets of fins extending from a surface thereof, the fins formed from the semiconductor substrate; an isolation layer formed over the semiconductor substrate, wherein the isolation layer has a thickness that is less than a height of the fins; a first transistor device formed over a topography provided by the first set of fins and the isolation layer, the first transistor device comprising: a semiconductor layer formed over the first set of fins, wherein the semiconductor layer has a planar surface and merges the first set of fins; and a gate body formed over the planar surface of the semiconductor layer; and a second transistor device formed over a topography provided by the second set of fins and the isolation layer.

Example 38 includes the subject matter of any of Examples 37 and 40 through 41, wherein the first transistor device has a Z width in the range of about 100-200 nm.

Example 39 includes the subject matter of any of Examples 37 and 40 through 41, wherein the first transistor device has a Z width in the range of about 200-300 nm.

Example 40 includes the subject matter of any of Examples 37 through 39, wherein the second transistor device comprises a fin-based field-effect transistor (finFET).

Example 41 includes the subject matter of any of Examples 37 through 39, wherein the second transistor device comprises a tri-gate metal-oxide-semiconductor field-effect transistor (MOSFET).

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future-filed applications claiming priority to this application may claim the disclosed subject matter in a different manner and generally may include any set of one or more limitations as variously disclosed or otherwise demonstrated herein.

What is claimed is:

1. An integrated circuit comprising:
    a semiconductor substrate having a plurality of fins extending from a surface thereof;
    a semiconductor body over a first sub-set of the plurality of fins and having a planar surface, wherein the semiconductor body merges the first sub-set of fins; and
    a first planar transistor having a gate body over the planar surface of the semiconductor body.

2. The integrated circuit of claim 1, wherein the plurality of fins are part of the semiconductor substrate.

3. The integrated circuit of claim 1, wherein the semiconductor substrate and the plurality of fins are distinct layers.

4. The integrated circuit of claim 1, wherein the semiconductor body comprises at least one of silicon (Si), silicon germanium (SiGe), and silicon carbide (SiC).

5. The integrated circuit of claim 1, wherein the semiconductor body is silicon (Si).

6. The integrated circuit of claim 1 further comprising a plurality of second non-planar transistors having a gate body over a second sub-set of the plurality of fins, wherein the first and second sub-sets of fins are adjacent to one another, and wherein the first and second gate bodies are electrically isolated from one another.

7. A system-on-chip (SoC) comprising the integrated circuit of claim 1.

8. A method of forming an integrated circuit, the method comprising:
    forming a plurality of semiconductor fins extending from a surface of a substrate;
    forming a semiconductor layer over a first sub-set of the plurality of fins, wherein the semiconductor layer has a planar surface and merges the first sub-set of fins; and
    forming a first planar transistor having a gate body over the planar surface of the semiconductor layer.

9. The method of claim 8, further comprising:
    depositing an isolation layer over the semiconductor substrate;
    planarizing the isolation layer to reduce its thickness to the height of the plurality of fins; and
    etching the isolation layer to reduce its thickness to less than the height of the plurality of fins.

10. The method of claim 8, wherein forming the semiconductor layer over the first sub-set of fins comprises:
    depositing the semiconductor layer over the first sub-set of fins; and
    planarizing the semiconductor layer to provide the planar surface.

11. The method of claim 10, wherein before depositing the semiconductor layer over the first sub-set of fins, forming the semiconductor layer over the first sub-set of fins further comprises:
    forming a blocking layer over a second sub-set of fins, wherein the blocking layer protects the second sub-set of fins during depositing the semiconductor layer over the first sub-set of fins.

12. The method of claim 11, wherein depositing the semiconductor layer over the first sub-set of fins includes depositing a semiconductor material that is more inclined to deposit on the first sub-set of fins than on the blocking layer.

13. The method of claim 11, wherein forming the blocking layer over the second sub-set of fins comprises:
    depositing the blocking layer over the plurality of fins; and
    removing the blocking layer from the first sub-set of fins.

14. The method of claim 8 further comprising forming a plurality of second non-planar transistors having a gate body over a second sub-set of the plurality of fins, wherein the first and second sub-sets of fins are adjacent to one another, and wherein the first and second gate bodies are electrically isolated from one another.

15. The method of claim 14, wherein the first and second gate bodies are formed simultaneously.

16. An integrated circuit, comprising:
    a semiconductor substrate having first and second sets of fins extending from a surface thereof;
    a semiconductor layer over the first set of fins, wherein the semiconductor layer has a planar surface and merges the first set of fins;
    a planar transistor device on the semiconductor layer; and
    a non-planar transistor device over a fin in the second set of fins.

17. The integrated circuit of claim 16, wherein the non-planar transistor device is a tri-gate transistor device.

18. The integrated circuit of claim 16, wherein the semiconductor layer comprises at least one of silicon (Si), silicon germanium (SiGe), and silicon carbide (SiC).

19. The integrated circuit of claim 16, wherein the first and second sets of fins are native to the semiconductor substrate.

20. The integrated circuit of claim 16, wherein at least one of the first and second sets of fins are not native to the semiconductor substrate.

* * * * *